US010224882B2

United States Patent
De Falco et al.

(10) Patent No.: US 10,224,882 B2
(45) Date of Patent: Mar. 5, 2019

(54) HARMONICALLY TUNED LOAD MODULATED AMPLIFIER

(71) Applicant: KABUSHIKI KAISHA TOSHIBA, Tokyo (JP)

(72) Inventors: Paolo Enrico De Falco, Bristol (GB); Gavin Watkins, Bristol (GB); Konstantinos Mimis, Bristol (GB); Kevin A. Morris, Bristol (GB); Souheil Ben Smida, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/406,151

(22) Filed: Jan. 13, 2017

(65) Prior Publication Data
US 2018/0205346 A1 Jul. 19, 2018

(51) Int. Cl.
*H03F 1/56* (2006.01)
*H03F 3/60* (2006.01)
*H03F 3/19* (2006.01)
*H03F 3/68* (2006.01)

(52) U.S. Cl.
CPC ............ *H03F 1/56* (2013.01); *H03F 3/19* (2013.01); *H03F 3/602* (2013.01); *H03F 2200/451* (2013.01); *H03F 2203/21103* (2013.01); *H03F 2203/21106* (2013.01); *H03F 2203/21139* (2013.01); *H03F 2203/21142* (2013.01)

(58) Field of Classification Search
USPC .............. 330/295, 124 R, 84, 286, 53–54
See application file for complete search history.

(56) References Cited

U.S. PATENT DOCUMENTS

| 4,772,856 A | 9/1988 | Nojima et al. |
| 7,061,317 B2 | 6/2006 | Petrovic et al. |
| 8,035,444 B2 * | 10/2011 | Okubo ............. H03F 1/0288 330/124 R |

(Continued)

FOREIGN PATENT DOCUMENTS

| JP | S63-153904 A | 6/1988 |
| JP | H7-46063 A | 2/1995 |

(Continued)

OTHER PUBLICATIONS

Nojima, T. et al. (1988). "High Efficiency Microwave Harmonic Reaction Amplifier," *IEEE MTT-S Digest*, LL-3; pp. 1007-1010.

(Continued)

*Primary Examiner* — Hieu Nguyen
(74) *Attorney, Agent, or Firm* — Finnegan, Henderson, Farabow, Garrett & Dunner, L.L.P.

(57) ABSTRACT

An embodiment provides an amplifier system with multiple amplification paths connected to a combiner for combination of signals amplified in the amplification paths, each amplification path comprising an amplifier and a matching network provided between the amplifier and the combiner, wherein the individual amplifiers can interact through the combiner, causing an active load-pull effect. The matching networks of the paths comprise harmonic terminations configured to one or more of reduce an overlap between the voltage and current waveforms within the amplifier connected to the matching network and improve the linearity of one or more of the amplifiers.

6 Claims, 13 Drawing Sheets

(56) References Cited

U.S. PATENT DOCUMENTS

| | | | |
|---|---|---|---|
| 9,806,673 B2 * | 10/2017 | Banerjee | H03F 1/0205 |
| 2005/0231286 A1 | 10/2005 | Gotou et al. | |
| 2008/0191801 A1 | 8/2008 | Kim et al. | |
| 2011/0273234 A1 | 11/2011 | van der Heijden et al. | |

FOREIGN PATENT DOCUMENTS

| | | |
|---|---|---|
| JP | 2005-303771 A | 10/2005 |
| JP | 2008-199625 A | 8/2008 |
| JP | 2014-175824 A | 9/2014 |

OTHER PUBLICATIONS

De Falco, P. E. et al. (2017). "Asymmetrical Outphasing: Exploiting Conjugate Continuous Modes of Operation," *PAWR*; pp. 18-21.

Mimis, K. et al. "Design Method for Harmonically-Tuned, Dynamic Load-Modulated Power Amplifiers," *GeMiC*, Mar. 16-18, 2015, Nünberg, Germany; pp. 1-4.

Mimis, K. et al. "Output Harmonic Optimisation of Dynamically Load Modulated Power Amplifiers," *Proceedings of the 46th European Microwave Conference*, Oct. 4-6, 2016, London, UK; pp. 1071-1074.

"Amplifier," located at <https://en.wikipedia.org/wiki/Amplifier> visited on May 31, 2017. (pp. 1-15).

"Doherty amplifier," located at <https://en.wikipedia.org/wiki/Doherty_amplifier> visited on May 31, 2017. (pp. 1-2).

\* cited by examiner

HARMONICALLY TUNED LOAD MODULATED AMPLIFIER

FIELD

Embodiments described herein relate generally to non-isolating load modulated amplifiers with second harmonic termination.

BACKGROUND

Mobile cellular subscriptions are predicted to grow to 9.2 Billion by 2020 when more than 25 Billion devices will be connected globally to wireless networks. To achieve the required increase in capacity, a densification in the number of Base Stations (BS) deployed will be necessary. Predictions show that, due to this, the amount of carbon dioxide emissions generated each year by BSs will exceed 350 Million tons.

The element with the biggest impact on the base station energy consumption is the Power Amplifier (PA). Several techniques have historically been adopted to improve the efficiency of PAs. Some technologies use single-ended PAs with reduced biasing angle or operated as switches. However, these PAs have low efficiency when amplifying signals with a high PAPR as their efficiency drops drastically when not operating at peak power. Efficiency enhancement architectures such as Envelope Tracking (ET) and Doherty as well as outphasing are also used. Techniques such as the Doherty and outphasing allow the base station to operate more efficiently when amplifying high peak-to-average power ratio (PAPR) wireless communication signals (LTE-A, MC W-CDMA, 802.11ac, DVB-T).

In known outphasing systems two PAs or more, are driven with constant envelope signals. The envelope modulation—present in the original signal—is reconstructed by vectorial summation of the individual output signals at the load. The summation process and consequently the accurate recreation of the amplitude modulation is controlled by the phase relationship of the individual signals passing through each PA path.

In the following, embodiments will be described with reference to the drawings in which.

DETAILED DESCRIPTION

Figure 1:
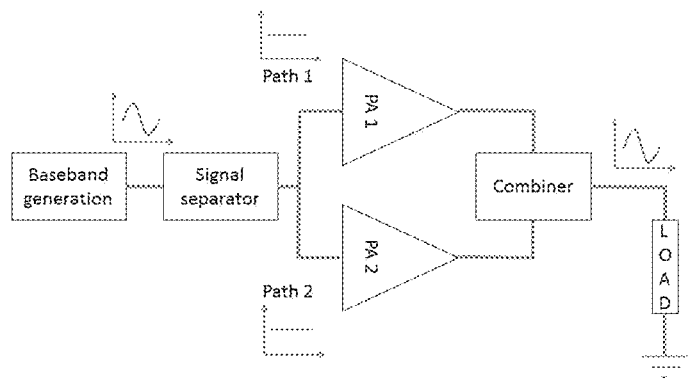
FIG. 1 shows a conventional two-way outphasing amplifier.

According to an embodiment there is provided an amplifier system with multiple amplification paths connected to a combiner for combination of signals amplified in the amplification paths. Each amplification path comprises an amplifier and a matching network provided between the amplifier and the combiner. The individual amplifiers in use interact through the combiner, causing an active load-pull effect. The matching networks of the paths comprise harmonic terminations configured to one or more of reduce an overlap between the voltage and current waveforms within the amplifier connected to the matching network during the active load pull operation and improve the linearity of one or more of the amplifiers. Additionally or alternatively the harmonic terminations may be configured to improve the efficiency and/or linearity of the amplifier system over a larger bandwidth than the bandwidth of an equivalent amplifier system that does not include optimised harmonic terminations.

The matching network may achieve the reduction in the overlap between the voltage and current waveforms by reflecting harmonics of the signal back to the amplifier, wherein they interfere with the signal to be amplified in a manner that reduces or eliminates the overlap between the voltage and current waveforms.

In an embodiment the harmonic terminations are dynamically adjustable. This allows adapting to changes in the signal that is to be amplified and/or in the baseband envelope of the signal to be amplified. In an embodiment the harmonic terminations are rendered dynamically adjustable by using tuneable components.

In one embodiment an RF signal generator configured to inject an RF signal into an amplification path is used. The RF signal is injected into the matching network in an embodiment. In this manner the frequency selective behaviour of the matching network can be changed/optimised for the received signal. Additionally and/or alternatively harmonic frequency content is injected upstream of the amplifier into the amplifier path. Appropriate harmonic signals are, in an embodiment, injected at the input of the individual amplification paths to enhance or support the harmonic separation and injection at the output of the individual amplifiers.

In an embodiment the amplifier is further configured to connect amplification path upstream of the combiner so that harmonic signal content of an amplification path is conveyed to another amplification branch in a manner that reduces the overlap between voltage and current waveforms in the amplifier of the other amplification path. In one embodiment the amplification path are connected via a phase shifting network.

In one embodiment different amplifiers operate in different operating modes. Each amplifier is optimised, through its harmonic terminations, to operate in the desired operating mode for given/predetermined input signal characteristics.

In known outphasing systems two or more identical amplifiers are used. This reduces development cost and simplifies the design but is suboptimal. Because the various paths are presented with different impedances trajectories—in a two way outphasing one with negative and the other with positive reactance—an asymmetrical design or PAs asymmetrically optimised is proposed. PA modes of operation may thus be chosen to be have conjugate operating modes, for example with one amplifier operating in Class-F for path 1 and Class-$F^{-1}$ for path 2 or in Class-J for path 1 and Class-$J^{-1}$ for path 2. In an embodiment the harmonic optimisation is carried out so that the mode of operation remains the same or so that it changes over the outphasing operation.

In one embodiment the amplifier is configured to disable one or more or all but one amplification path if the power of the input signal is below a predetermined threshold.

In one embodiment the amplifier is further configured to determine a power of an input signal and to disable the harmonic terminations if the determined input power is below a predetermined threshold.

In one embodiment the system is a base station, a multi standard base station, a satellite, a node in a mobile area network and/or a node in a WLAN.

In one embodiment a system comprising an aforementioned amplifier is provided. The system is a 802.11ac WiFi, LTE, LTE-A and/or DVB-A system.

FIG. 1 shows a conventional two-way non-isolating outphasing amplifier. This system allows interaction between the two PA paths. This interaction causes an active load-pull effect resulting in the two PAs seeing both resistive and reactive load variations as a function of the output power back off. Conventional amplifiers presented with reactive loads show a degradation in efficiency as the, uncompensated, reactance shapes non-optimal current and voltage waveforms leading to higher power dissipation by the device, linearity degradation and output power loss.

Moreover, in Doherty amplifiers that operate over wide bandwidths the load modulation trajectory can shift due to the frequency/phase dispersion of the combining networks (quarter wavelength line, offset lines). This shift causes the PAs to operate under reactive loads.

Figure 2:
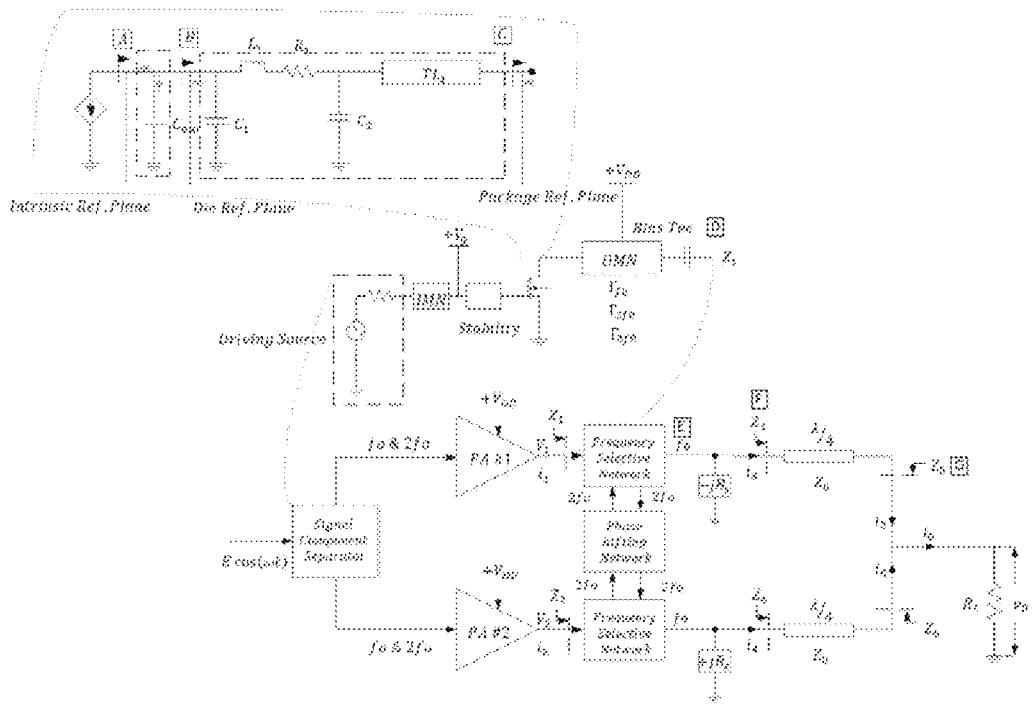
FIG. 2 shows the different planes of a harmonic injection outphasing system.

FIG. 2 shows the different planes of analysis of a harmonically tuned outphasing system and will be used as a reference in parts of the following description.

Figure 3:
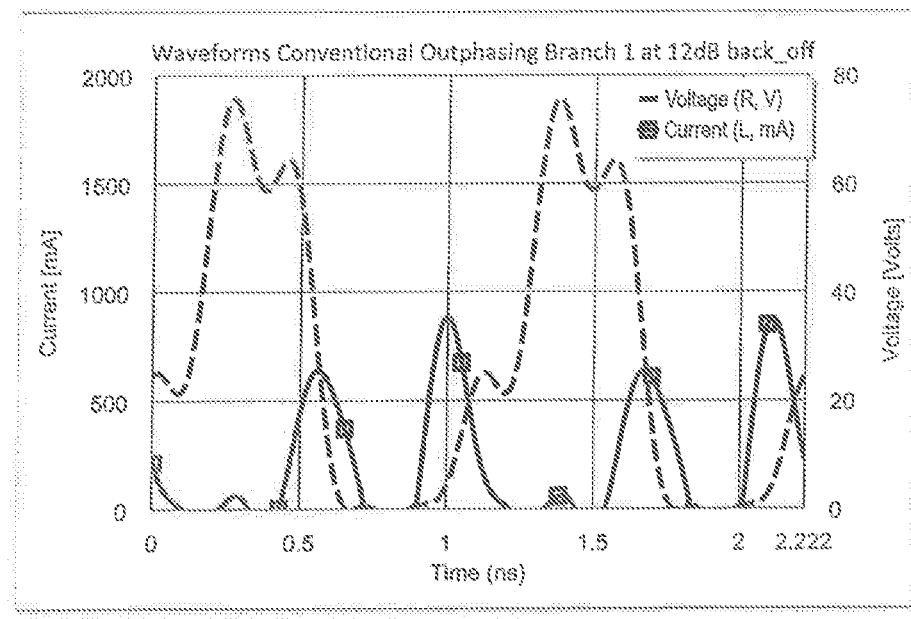
FIG. 3 shows a simulation of the current and voltage waveforms at plane A of path 1 in the system of FIG. 1 at 12 dB backoff.

FIG. 3 is provided to illustrate, by way of example only, the reason for the limited efficiency in known load modulated amplifier systems. FIG. 3 illustrates voltage and current waveforms present at plane A of one branch of a simulation of a load modulated PA system (the outphasing system shown in FIG. 1 with harmonic termination optimised for saturation operation), at 12 dB back off. The overlap between the current and voltage waveforms causes power dissipation that reduces the efficiency of the PA system. It was realised that it is the presence of reactance at plane A that causes this overlap between the current and voltage waveforms. In some embodiments this reactance is reduced or removed to reduce or remove the overlap between the voltage and current waveforms, thereby increasing the efficiency of the PA system.

The harmonic content at the output of the individual amplifiers can be the result of various mechanisms. Inherent device nonlinearities, for example, will produce harmonic content. The signal separator shown in FIG. 1, for example, can be designed to add a harmonic component to the separated signals. Operating the PAs in saturation will also produce harmonically rich outputs. The inventors have realised that the harmonic signal content can be used in optimising the performance/efficiency of the amplifiers. Whilst in the following reference to second harmonics is being made in places, the embodiments are not limited to the use of second harmonics and different order harmonics may be used instead and/or additionally for optimisation.

Figure 4:
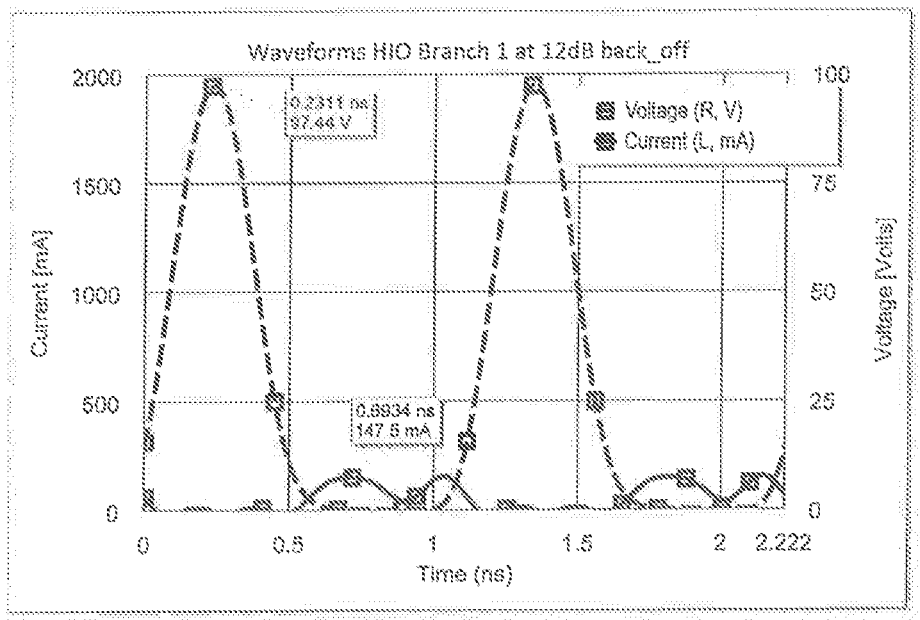
FIG. 4 shows the same simulation as shown in FIG. 3 but with optimised second harmonic impedance.

FIG. 4 illustrates an examples of voltage and current waveforms achieved through the use of second harmonics optimisation for the same circuit that has formed the basis of the simulation results shown in FIG. 3. In this case a second harmonic component of the output of one PA reflected back to the PA by an output matching network placed downstream of the PA. In doing so the overlap between the current and voltage waveforms within the PAs was drastically reduced and the efficiency of the PA was improved. Harmonic terminations are consequently used to 'compensate' for the reactive loading generated during the outphasing operation.

In the following different ways of second harmonics optimisation are discussed in more detail.

The nature of the input signals that are to be amplified as well as the variation in the output load that is to be expected during operation are generally known at the design stage of the amplifier. Second harmonic optimisation can be achieved either by experimental or analytical means, as discussed later herein.

Figure 5:
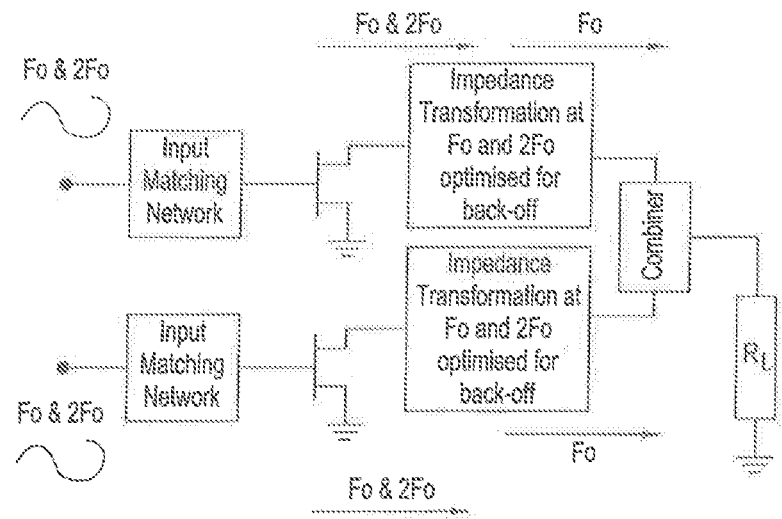
FIG. 5 shows a load modulated dual drive PA system in which static second harmonics optimisation for the matching networks in the two branches has been provided.

The example circuit illustrated in FIG. 5 shows a dual drive PA system that receives the signal to be amplified alongside second harmonics signals. The second harmonics signal may, for example, originate from a splitter (not illustrated) located upstream of the signal inputs that has generated the two signals $F_0$. It will be appreciated that the two harmonic signals $2F_0$ that are individually injected into the two branches of the amplifier system are not necessarily identical and can be different signals. The system shown in FIG. 5 moreover comprises, in each branch, an output impedance matching network between the PA and the combiner. The output matching network is designed to only pass the fundamental signal to the combiner and to reflect second harmonics of the signal back to the amplifier. By selecting the properties of the impedance transformation network appropriately the reactive component of the fundamental impedance present at the amplifier input can be compensated for. Interference between the signal to be amplified and the reflected harmonic signal further reduces overlap between the voltage and current waveforms within the PA, even under the effect of load modulation. Given that the two branches experience different load modulating effects it will be appreciated that the matching networks are independently optimised for the input signals and the expected output modulation effects. If, as is the case in the embodiment shown in FIG. 5, second order harmonics are injected into the amplifier paths, the injected harmonics are shaped to ensure that they, jointly with the impedance transformation network reduce or eliminate the overlap between the voltage and current waveforms within the PAs. The injected second order harmonics and the impedance transformation network are consequently jointly optimised in the embodiment. In the example circuit shown in FIG. 6 a single RF input is used and the input signal $F_0$ as well as the second harmonic signals $2F_0$ are provided to the two PA branches using a RF splitter. The second harmonics signal $2F_0$ input to the RF signal decomposition circuit is modified by the RF signal decomposition circuit, so that the second harmonics signals $2F_0$ present in the two PA branches differ from the original input signal $2F_0$.

$2F_0$ is again optimised, in combination with the individually optimised output matching networks located between the PA and the combiner in each branch, to reduce the overlap between the voltage and current waveforms in the individual PAs. The two impedance matching networks again only pass the amplified signal $F_0$ to the combiner, reflecting the second harmonics $2F_0$ back to the amplifier. As is the case for the circuit shown in FIG. 5, the second harmonics signal $2F_0$ and the matching networks are statically optimised for a predetermined backup range as well as predetermined expected signals.

Figure 6:
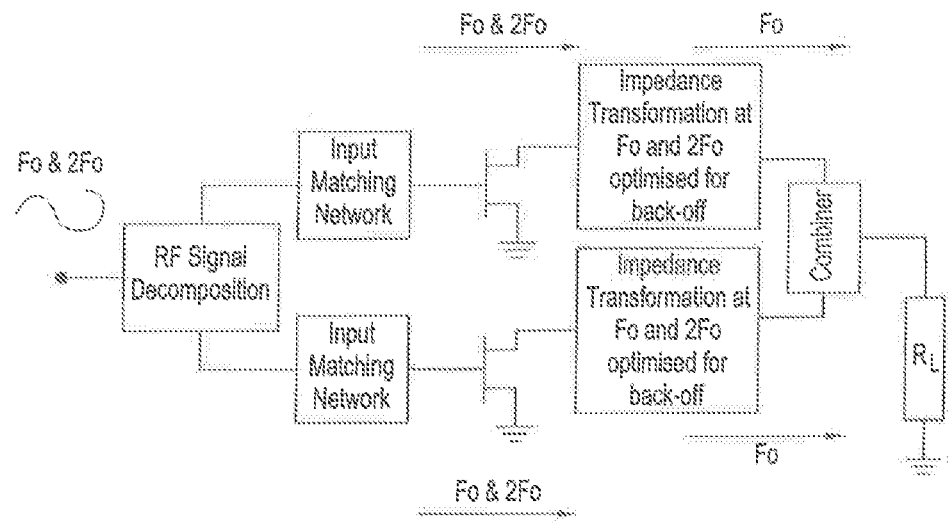
FIG. 6 shows a load modulated PA system in which static second harmonics optimisation for the matching networks in the two branches has been provided.
Figure 7:
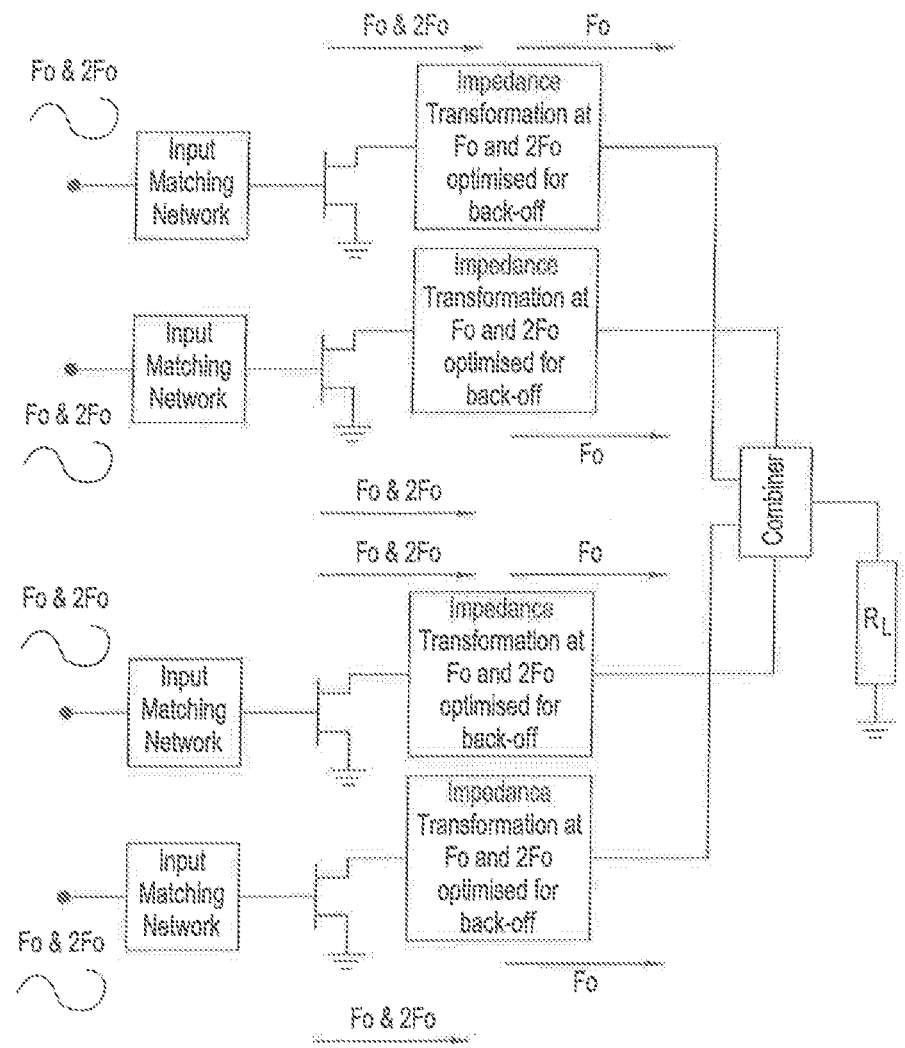
FIG. 7 shows a load modulated N-way drive PA system in which static second harmonics optimisation for the matching networks in the two branches has been provided.

The principles illustrated in FIGS. 5 and 6 do not solely apply to PA systems comprising 2 PAs but extend to PA systems with a different number of PAs. FIG. 7 illustrates a system similar to that shown in FIG. 5 but comprising four individual driven branches for four individual PAs. It will be appreciated that the embodiments are not limited by the number of PAs used and that all examples discussed herein are applicable to systems comprising any plurality of PA branches as long as at least some of these branches are combined in a non-isolating fashion.

Figure 8:
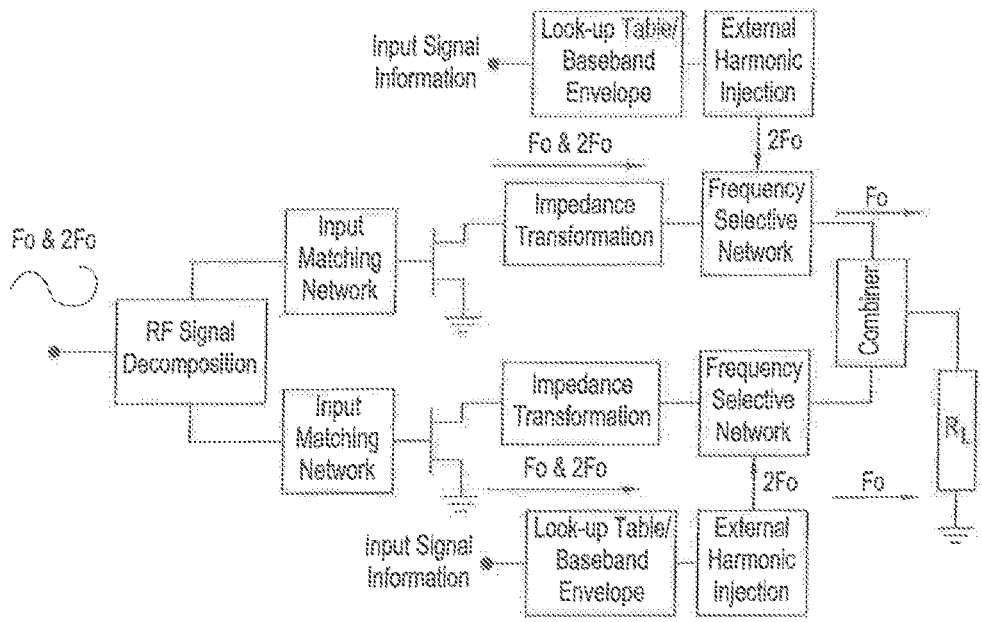
FIG. 8 shows a PA system with external second harmonic signal injection.

In addition to the above discussed statically designed networks, networks that change their properties based on changes in the input signal are also provided in embodiments. The embodiment illustrated in FIG. 8 shows a network similar to that shown in FIG. 6. However, the statically optimised matching network provided between the PA and the combiner in each branch in FIG. 6 is replaced in each branch of FIG. 8 by an impedance transformation network provided in series with a frequency selective network. The frequency selective network is configured to provide a frequency dependent impedance transformation that, in conjunction with the impedance transformation network and the $2F_0$ signal input at the RF signal splitter reduces the overlap between the current and voltage signals in the PAs. The frequency selective network moreover passes the fundamental frequency to the combiner and to reflect second harmonics back to the amplifier.

The frequency selective network receives second harmonics signals from a harmonic injection circuitry external to the frequency selective network. The frequency selective network does not pass the injected second harmonic signal present at the output terminals of the connected PA to the combiner and instead reflects the injected second harmonic signal, together with the/any second harmonic signal received at the input of the circuit, back to the respective PA, thereby influencing the waveforms in the amplifier and reducing overlap between voltage and current waveforms. It will of course be appreciated that in another embodiment the harmonic injection circuit does not have to be external to the frequency selective network and can, instead be formed together with the frequency selective network.

The harmonic injection circuitry receives an analogue signal from the look up table. The harmonic injection circuit may, for example, be an oscillator that is connected to provide the appropriate harmonics to the frequency selective network and that changes the frequency or frequencies of the signal(s) it provides at its outputs on the basis of analogue input received from the look up table. This in turn allows the harmonic injection circuit to provide harmonic signals to the frequency selective network that are tailored to the requirements of the input signal to be amplified. It will be appreciated that, as the load modulation affects the two branches differently the harmonics injected into the frequency selective network can be varied independently for the individual branches.

Instead of a look up table the circuit providing input to the external harmonic injection may alternatively provide an analogue signal that is based on the baseband envelope of the input signal $F_0$. In another alternative embodiment the parameters to be input to the harmonic injection circuit are not determined from a look-up table but instead calculated on the fly, for example using a processor based on a predetermined, stored relationship between the input signal information and the parameters to be input to the harmonic injection circuit for the current input signal.

Figure 9:
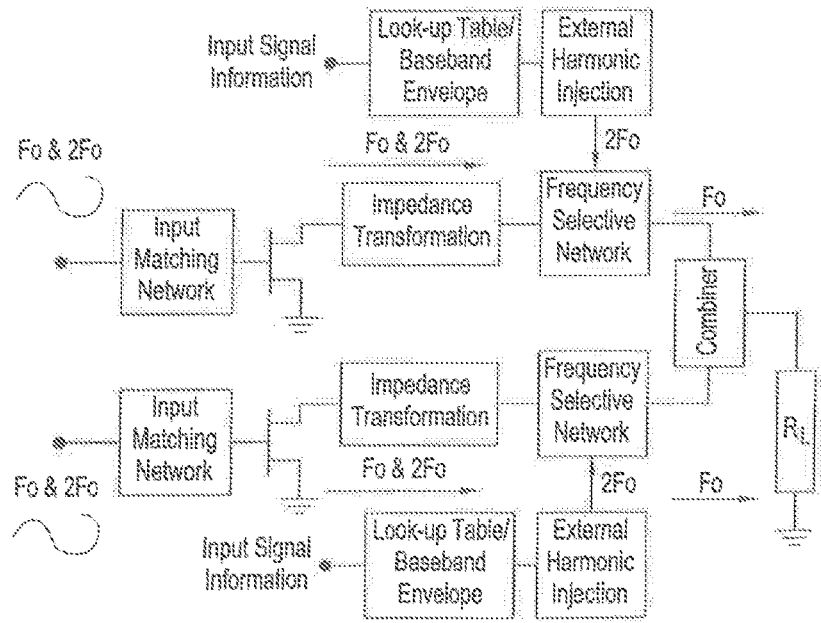
FIG. 9 shows a dual drive PA system with external second harmonic signal injection.

FIG. 9 shows a circuit identical to the circuit shown in FIG. 8 but with independently driven PA paths.

In an implementation where the harmonics are injected and controlled dynamically, the opportunity of adapting to device aging arises for either maintaining efficiency or linearity or both. This is the case in both of FIGS. 8 and 9 for single input and dual drive, respectively. Outphasing systems and most efficiency enhancement systems tend to be optimised for operation under certain input signals using their typical statistical properties. The efficiency profile of the proposed amplifier can be reconfigured through the adaptation of the harmonic optimisation. This makes it adaptable to different signals and changing/aging component properties.

Figure 10:
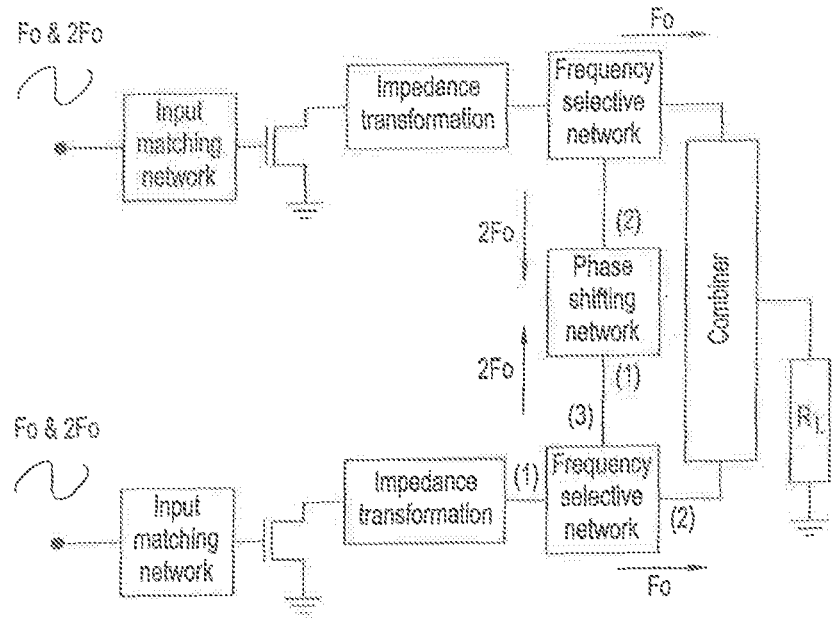
FIG. 10 shows a dual drive PA system with a static phase shift circuit connecting two PA branches.
Figure 11:
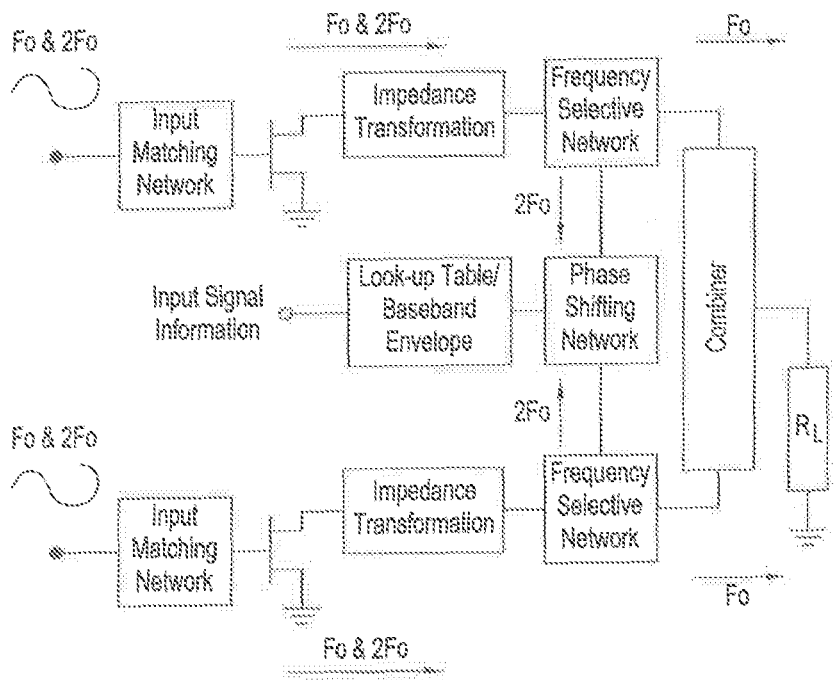
FIG. 11 shows a dual drive PA system with a dynamically tunable phase shift circuit connecting two PA branches.
Figure 12:
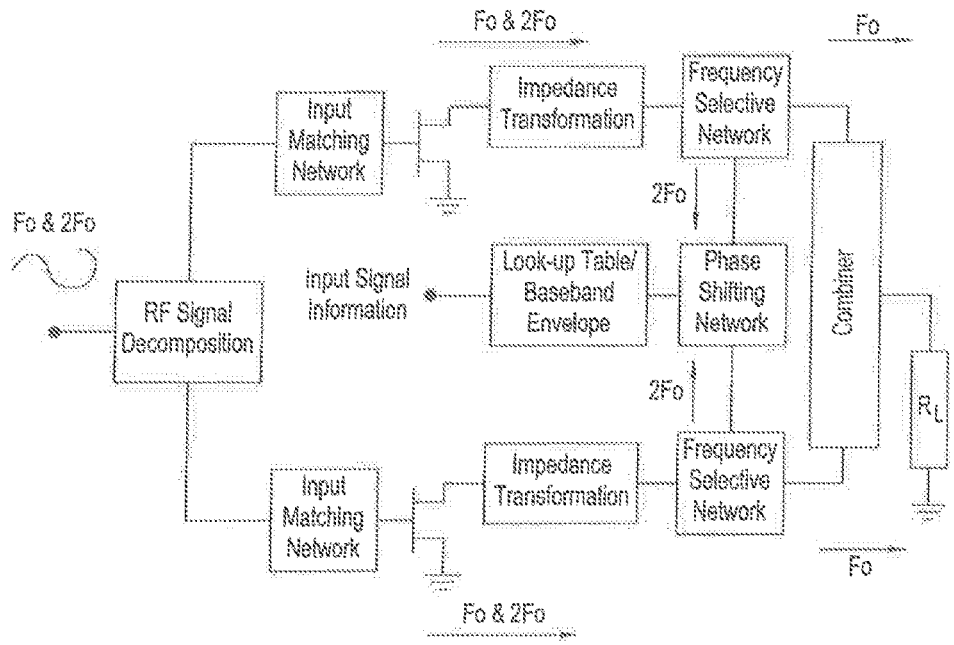
FIG. 12 shows a PA system with a dynamically tunable phase shift circuit connecting two PA branches and an RF signal decomposition circuit.

FIGS. 10 to 12 show yet another way of applying second harmonic optimisation. As can be seen from FIG. 10, each of the two branches of the PA system comprise a frequency selective network, as is also the case in the networks shown in FIGS. 8 and 9. In FIG. 10, however, the signals injected into the two frequency selective networks are not provided by external circuitry but are the second harmonic signals of the opposite PA branch, modified by their passing through the phase shifting network shown in FIG. 10 and connecting the two frequency selective networks of the two branches. The phase shifting network optimises the second harmonics provided between the two branches so that the overlap between voltage and current waveforms is reduced, minimised or even eliminated whilst removing the second harmonic signals $2F_0$ from the output signal provided to the combiner. The frequency selective networks at the respective outputs of the two PAs allows for the second harmonics to be directed towards the alternate PA while preventing fundamental power from leaking through.

The system shown in FIG. 10 comprises a static phase shifting network that has been optimised for a predetermined back off range as well as for known, expected input signals. FIG. 11 shown an alternative circuit that is identical to the circuit shown in FIG. 10 with the exception that the phase shifting network is adapted to dynamically change its phase shift over a predetermined frequency range based on input received from a look up table. The look up table determines the parameters to be provided to the phase shift network on the basis for signal information, in particular information identifying the signal envelope, received at its input. In an alternative embodiment, instead of driving the phase shifting networks digitally using the look-up table and based on knowledge of the input signal of the system, the phase shifting network could be driven by the baseband envelope of the input signal. In an embodiment the phase shifting networks use passive filter configurations with MEMS or varactors as the elements tuneable based on the input signal received from the look up table/the baseband envelope.

FIG. 12 shows an embodiment identical to that shown in FIG. 11 but replacing the dual drive input with a single drive and a RF signal decomposition circuit.

While the embodiments shown in FIGS. 5 to 12 each include the injection of second order harmonics other embodiments based on the circuit architectures shown in these figures second order harmonics are not injected and, instead, the components of the circuitry are designed to generate second order harmonics optimised to, in combination with the other components of the circuitry, in particular with the above discussed impedance transformation networks, frequency selective networks and phase shifting networks.

Figure 13:
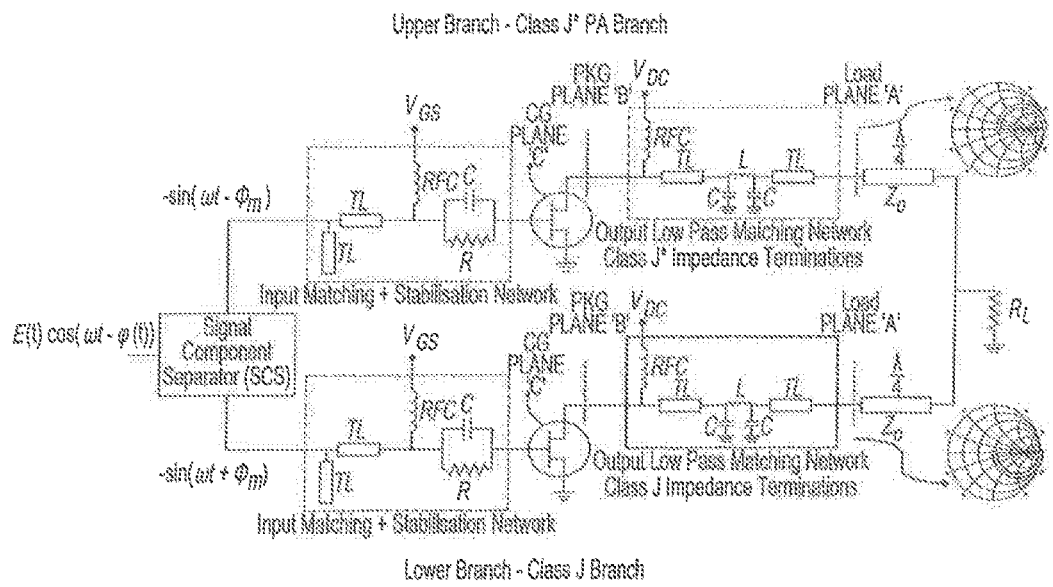
FIG. 13 shows details of the load modulated PA system of FIG. 6.

The signals that are to be transmitted by the amplifier system have a known probability density function. The optimum harmonic impedance for such signals can be determined analytically or can be measured on the type of PA system for which the load-pull effect is to be compensated to optimise the system's efficiency. In the following, a way of analytically determining second harmonic optimisation parameters is discussed with reference to FIG. 13. In an outphasing system with lossless combining, as shown in FIG. 13, the reactive loading taking place at the load plane A of the upper and lower branch amplifiers is defined in by Raab (F. Raab, "Efficiency of outphasing RF power-amplifier system," IEEE Transaction on Communications, vol. 33, no. 10, pp 1094-1099, 1985) as:

$$Y_{1,2}(\phi) = R_{load}\frac{2\cos^2\phi}{Z_0^2} \pm jR_{load}\frac{\sin 2\phi}{Z_0^2} \quad (1)$$

where $\phi$ is the outphasing angle, related to the output backoff $\beta=20\log_{10}(\cos^2\phi)$. $Z_0$ and $R_{Load}$ are the characteristic impedance of the $$\frac{\lambda}{4}$$

line and the load impedance indicated in FIG. 13.

Figure 14:
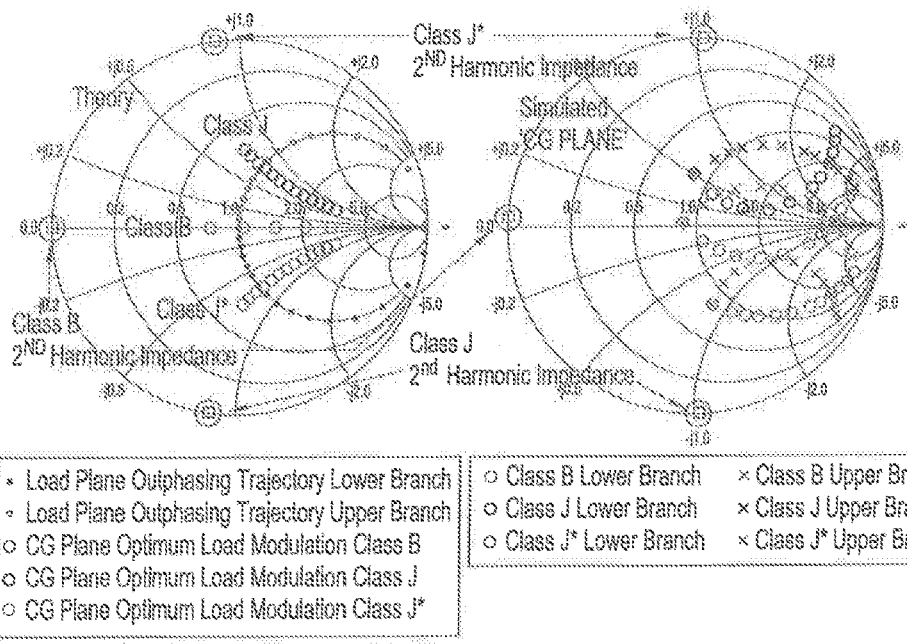
FIG. 14 shows ideal outphasing and load modulation trajectories for the circuit shown in FIG. 13 on the left and, on the right, the simulated CG plane impedances for Class B, J and J* PAs with optimal outphasing upper and lower branch loading.

FIG. 14 shows ideal outphasing and load modulation trajectories for the circuit shown in FIG. 13 on the left and, on the right, the simulated CG plane impedances for Class B, J and J* PAs with optimal outphasing upper and lower branch loading. To evaluate the impact of the load modulation trajectories on the efficiency of the PA the load modulation at the intrinsic CG plane of the device which is affected by the output matching network (OMN) and by the device-specific output parasitics is determined. The load modulation trajectory from load plane 'A' to the CG plane 'C' in FIG. 13 can be determined as a function of the outphasing angle and the output matching network s-parameters, approximating the device's parasitics as a linear two port network:

$$\Gamma_{PKG}(\phi) = S_{11}^m + \frac{(S_{21}^m)^2\Gamma_\phi}{1 - S_{22}^m\Gamma_\phi} \quad (2)$$

$$\Gamma_{CG}(\phi) = S_{11}^p + \frac{(S_{21}^p)^2\Gamma_{PKG}}{1 - S_{22}^p\Gamma_{PKG}} \quad (3)$$

where $S^p$ are the s-parameters of the equivalent output parasitic model, $S^m$ are the s-parameters of the output matching network and $\Gamma_0$ can be determined from the admittance in Equation 1.

The optimal impedances for a given continuous mode of operation can be defined at the CG plane as a function of back-off $\beta$ and for different values of the continuous design space parameter $\delta$, as previously shown in K. Mimis and G. T. Watkins, "Design method for harmonically-tuned, dynamic load-modulated power amplifiers," in 2015 German Microwave Conference, pp. 1-4, IEEE, 2015 and L. Xiang, M. Helaoui, and F. Ghannouchi, "Optimal Fundamental Load Modulation for Harmonically Tuned Switch Mode Power Amplifier," Microwave Symposium (IMS), 2015 IEEE MTT-S International, 2016. For Class B/J continuous mode PAs the CG fundamental and second harmonic impedances, shown in FIG. 13, are defined as: $Z_{f0}=R_{opt}+j\delta R_{opt}$ and $$Z_{2f0} = -j\frac{3\pi}{8}\delta R_{opt}.$$

Where $\delta \in [-1,1]$, $R_{opt}$ is the optimal resistance defined as $$R_{opt} = 10^{\frac{|\beta|}{20}} R_L.$$

and $R_L$ is the slope of the ideal Class B loadline $$R_L = \frac{2(V_{DC} - V_{knee})}{I_{max}}.$$

The reactance of the second harmonic impedance, proportional to $R_{opt}$ and $\delta$, varies as a function of back-off. Moving across the design space it is possible to find a fundamental load modulation trajectory which allows optimal operation with a fixed second harmonic termination. For $\delta \neq 0$ the optimal fundamental load modulation trajectory can be defined as: $Z_{opt}=R_{opt}+j\alpha R_{opt}$, where $\alpha$ is the new design space parameter, determined by the output backoff and the initial design space $$\alpha = 10^{\frac{\beta}{20}}\delta.$$

The optimal fundamental load modulation for modes J and J* follows the complex trajectories shown on the left side of FIG. 14. Only for Class B amplifiers with $\delta=0$ does the optimal fundamental load modulation remain on the real axis. The outphasing trajectory can be engineered to follow the optimal load modulation for harmonically tuned amplifiers by choosing appropriate values for δ in each branch and optimising the phase shift introduced by each amplifier's output matching network.

In one embodiment the convexity and concavity of the lower and upper branch load trajectories can be exploited to follow the optimal load modulation profile of conjugate modes of operation. The concave upper branch trajectory favours Class J (δ=1) optimum fundamental load modulation, while the convex lower branch profile matches the optimal fundamental trajectory of Class J* PAs (δ=−1) as evidenced in FIG. 14. Once the values for δ are chosen, the optimal load modulation trajectory previously introduced as $Z_{opt}$ can be calculated for both branches and set as a target. The $S_{11}^m$ of the output matching network of each PA is determined by the mode of operation through the choice of $R_L$ and δ. With knowledge of the devices output parasitics and assuming reciprocal and lossless output matching networks, Equation 3 can be re-arranged so that the argument of $S_{21}^m$, the phase shift introduced by each output matching network, remains as the only unknown. The phase shift is selected to minimise the vectorial distance between $\Gamma_{CG}(\emptyset)$ and the optimal target impedance trajectory for each branch amplifier.

After defining the optimal impedances, the harmonic terminations are then synthesised in both amplifier paths with passive multi-harmonic output matching networks—a technique well known in the art.

It will be appreciated that the above analytical derivation of the parameters optimally used in maximising efficiency of the circuit shown in FIG. 13 relates to a particular example only and that similar derivation can be made for other circuit architectures. By simulating the behaviour of the system at discrete points of the outphasing load modulation trajectory the value of second harmonic impedance (defined by a magnitude and phase) maximising efficiency at every point can be found. At each point of the outphasing trajectory all values of second harmonic impedance can be tested using tuners. As the second harmonic is to be reflected back to the amplifier the magnitude of the reflection coefficient is usually fixed and only the phase is varied. This results in a sweep of second harmonic impedance values from 0 to 360 degrees on the edge of the smith chart.

In the following an example of a way of deriving optimum design parameters using simulation is described.

In all simulations presented in this disclosure a trusted nonlinear model for a 10W GaN HEMT (CREE CGH40010F) was used, comprising a PA biased in Class B with a simple, fundamental only, high pass L-section output matching network. This useful for the successful operation of the architecture as the harmonics—that are typically reflected back to the PA—can be passed through and injected in the alternate outphasing path in the manner shown in FIGS. 10 to 12.

To determine optimal second harmonic experimentally simulations can be conducted on a PA loaded with a number of different load impedances which are determined from the known upper outphasing trajectory. Each of the different load impedances provides a different amount of active load pull. For each of the different load impedances simulations covering all possible values of second harmonic termination are presented at the output of the PA. For each of the different load impedances the value of second harmonic which results with best efficiency (lowest overlap between the voltage and current waveforms) is picked as the most suitable second harmonic. The same process is repeated for the lower outphasing trajectory.

Figure 15:
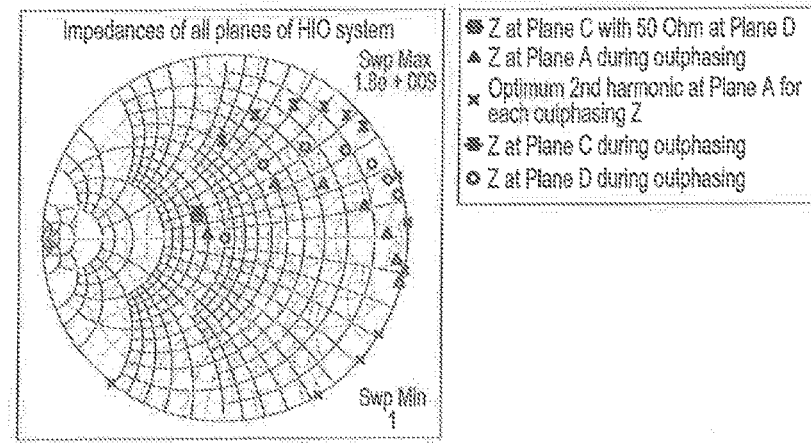
FIG. 15 shows impedances at various of the reference planes indicated in FIG. 2 for path 1 of a simulated Chireix/outphasing system.
Figure 16:
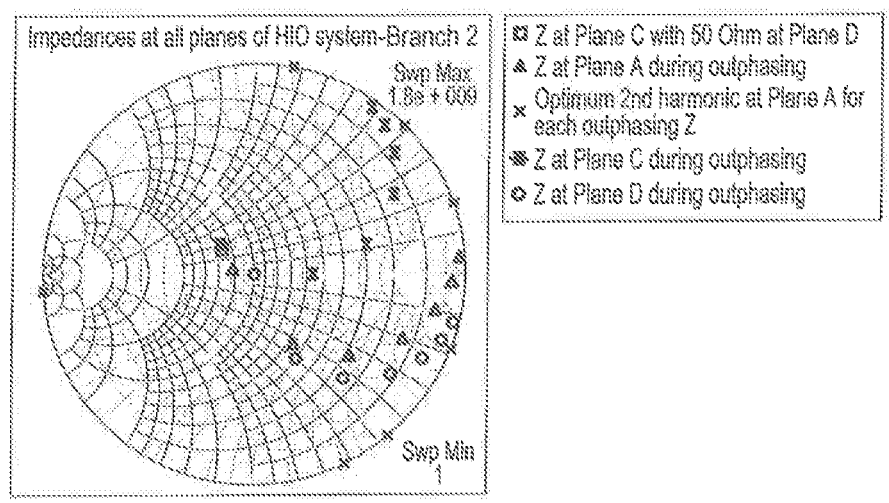
FIG. 16 shows impedances at various of the reference planes indicated in FIG. 2 for path 2 of the simulated Chireix/outphasing system.
Figure 17:
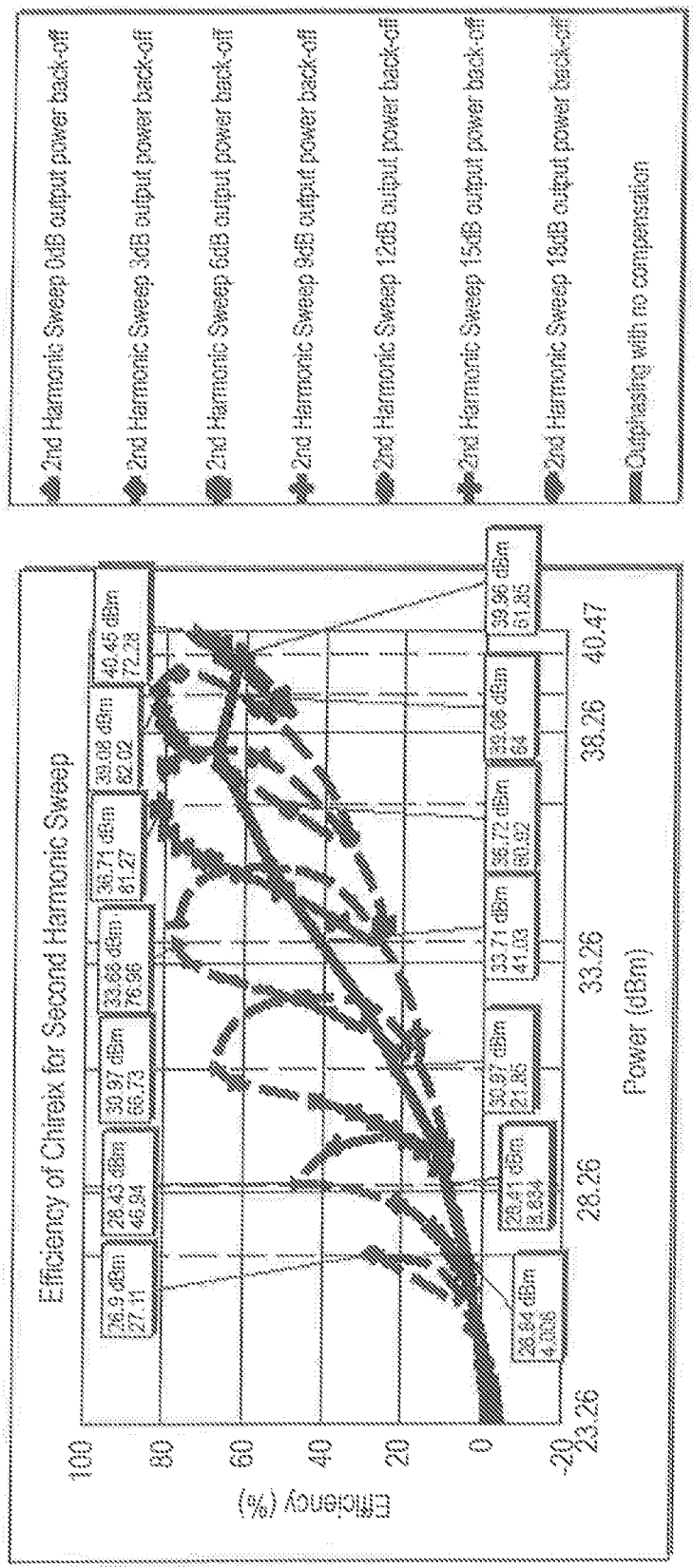
FIG. 17 shows the efficiency of path 1 of an outphasing PA versus back-off for swept second harmonic impedance at every point in the outphasing impedance trajectory.
Figure 18:
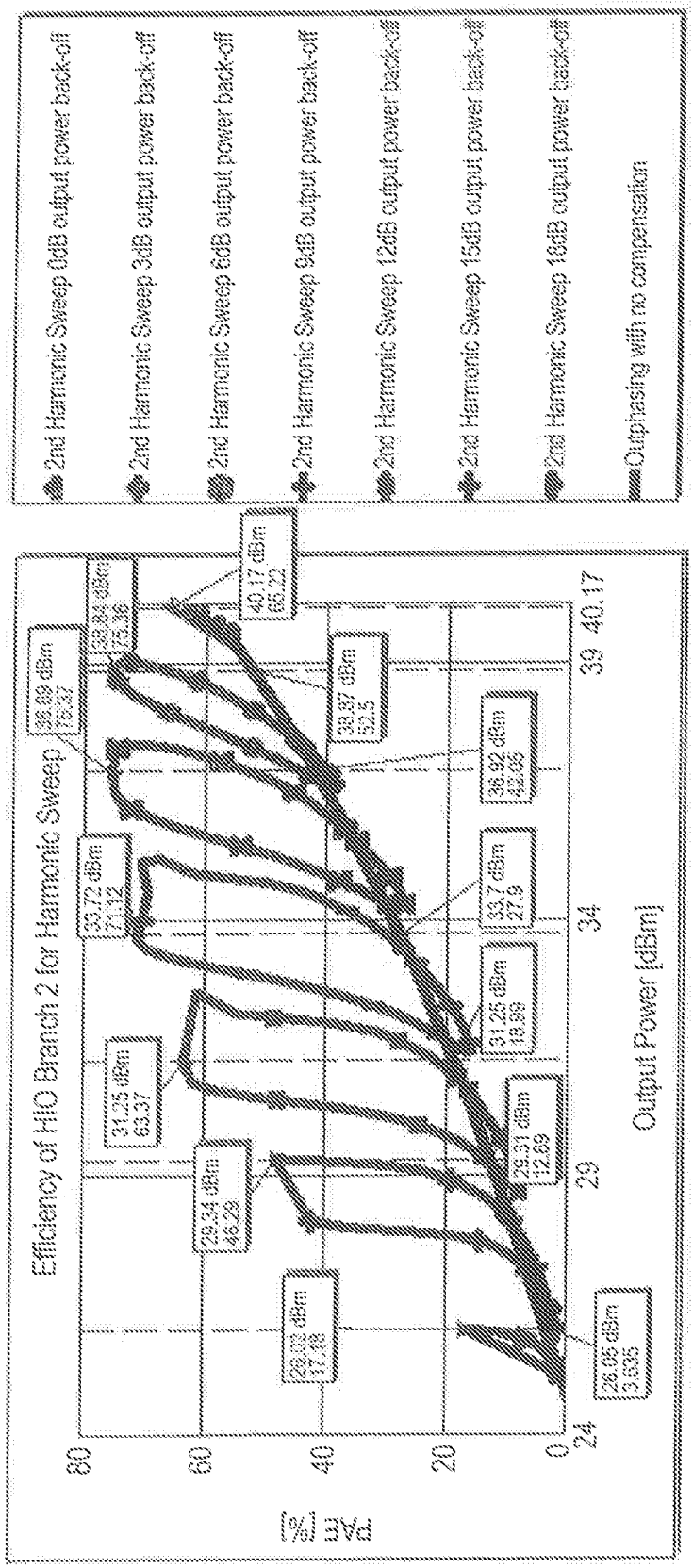
FIG. 18 shows the efficiency of path 2 of an outphasing PA versus back-off for swept second harmonic impedance at every point in the outphasing impedance trajectory.

The fundamental load impedance that mimics the trajectory of an outphasing amplifier synthesised at each PA output are plotted in FIGS. 15 and 16. Each trajectory corresponds to a different one of the reference planes shown in FIG. 2. As can be seen from FIGS. 15 and 16, based on these simulations the optimum second harmonic at plane A for each outphasing impedance can be derived in the above discussed manner. The simulations allow determining the reactive components of the fundamental impedance present at plane A in the absence of second harmonics optimisation and, on the basis of the determined reactances, to derive those second harmonics that reduce, minimise or even eliminate these reactive components. To emulate the harmonic injection effect, harmonic tuners were used to sweep the harmonic loads at each point in the outphasing trajectory. The effect of a $2^{nd}$ harmonic sweep in PA efficiency is plotted in FIGS. 17 and 18. As can be seen from these two figures, the maximum efficiency achievable in the embodiment significantly exceeds the efficiency of an outphasing amplifier that does not use the embodiment with performance improvements in terms of Power Added Efficiency (PAE) compared to conventional outphasing over an 18 dB output power back-off range being possible. Additionally, PAE is maintained constant over more than 10 dB output power back-off.

From the optimum second harmonic impedance termination at plane A shown in FIG. 2 it is possible to carry out an impedance transformation to plane B at FIG. 2 based on knowledge of the amplifier parasitics, thereby determining the impedance required to be presented by the output matching network. This provides the basis for determining the required second harmonic which needed to be injected into the system or to co-design the output matching networks and the second harmonics for injection into the system.

Any of the above discussed techniques can be used to design the passive harmonic termination network (for the static case) or drive the phase shifting networks or the external harmonic injection for the case of single and dual input drive respectively. By using the above well-defined design methodologies in designing the load modulated amplifier/outphasing system PAs of the individual paths can be co-designed and optimised together with the power combiner of the output. Different choices of combining (lossless, Chireix with different compensating susceptances) or of matching networks (lumped, distributed) and topologies provide degrees of freedom which can be exploited to achieve a more favourable design space. The use of other efficiency enhancement techniques such as envelope tracking and dynamic gate adjustments in combination with the embodiment are possibilities to further increase efficiency at back-off.

Figure 19:
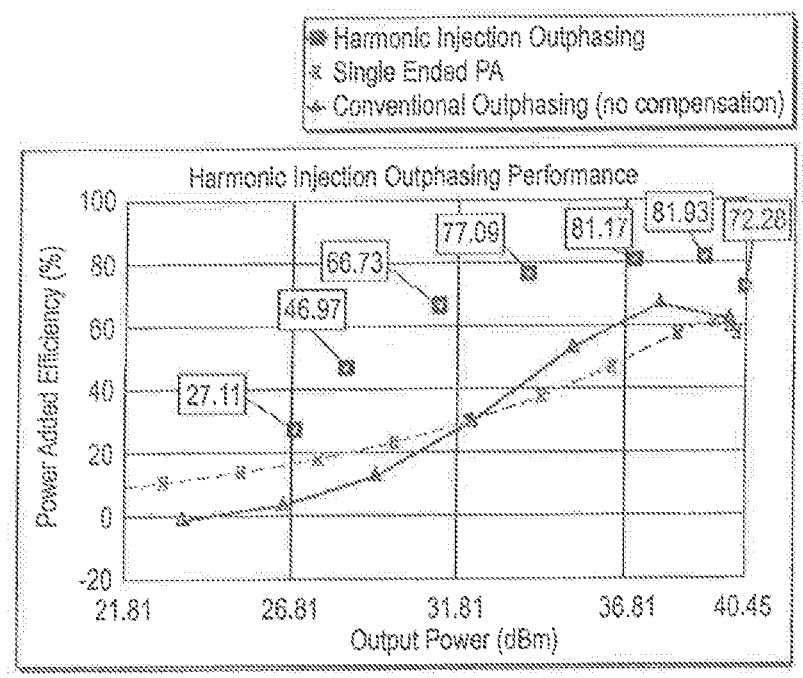
FIG. 19 shows the results of a direct comparison of the PA efficiency vs output power for a Class B PA with idealised components and using uncompensated/conventional outphasing (Δ), a conventional outphasing amplifier (⋈) and a harmonic injection outphasing system according to an embodiment (□)

FIG. 19 shows the results of a direct comparison of the PA efficiency vs output power for a Class B PA with idealised components and using uncompensated/conventional outphasing (triangular symbols), a conventional outphasing amplifier (hourglass shaped symbols) and a harmonic injection outphasing system according to an embodiment. As can be seen from this figure, the amplifier of the embodiment outperforms the other amplifiers by a considerable amount. As can be seen form this figure, the advantages of the embodiment increase with increasing power output. In one embodiment the second harmonic optimisation is only applied above a predetermined output power level whilst relying on in-phase amplification below this output level, thus operating as a mixed mode system.

Another mixed mode system according to an embodiment is operated using one of the above described harmonic injection techniques, with one PA path being disabled for back-off of less than 30 dB.

For larger dynamic range one of the paths could be deactivated at extreme output power back-offs.

Figure 20:
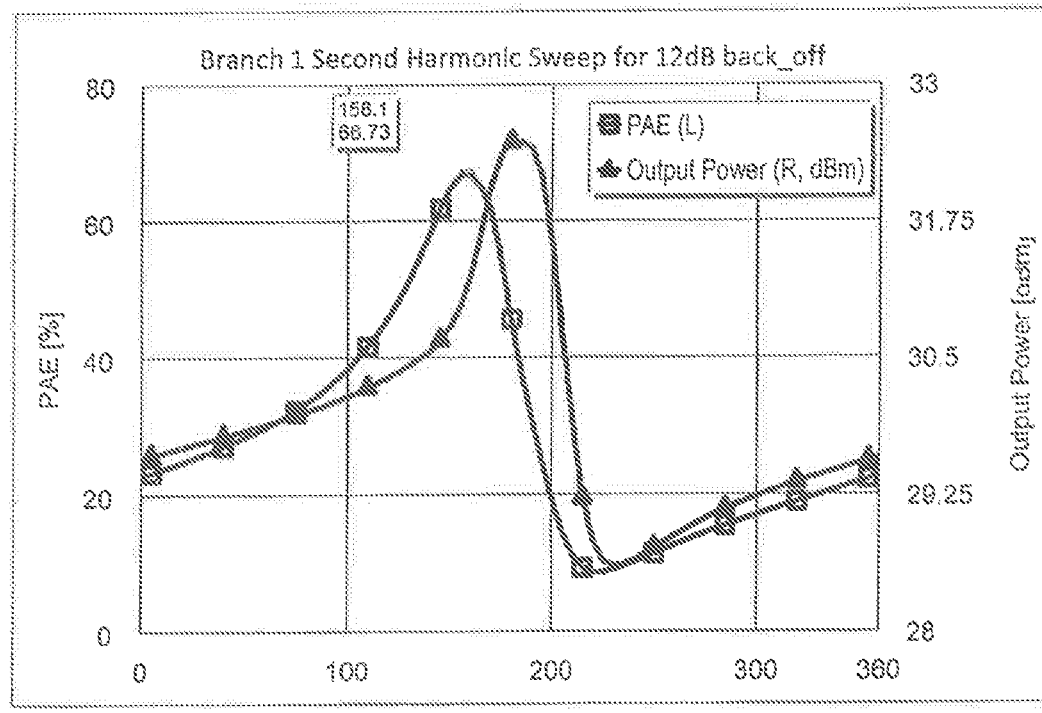
FIG. 20 shows the simulation of PA efficiency and output power for the top PA paths of an outphasing system terminated with a fundamental impedance that corresponds to 12 dB back off, while sweeping the second output harmonic impedance.

FIG. 20 shows the simulation of PA efficiency and output power for the top PA paths of an outphasing system terminated with a fundamental impedance that corresponds to 12 dB back off, while sweeping the second output harmonic impedance. With harmonic injection it is possible to gain 1-2 dB output power and achieve a PA efficiency of above 60% at the 12 dB output power back off.

Figure 21:
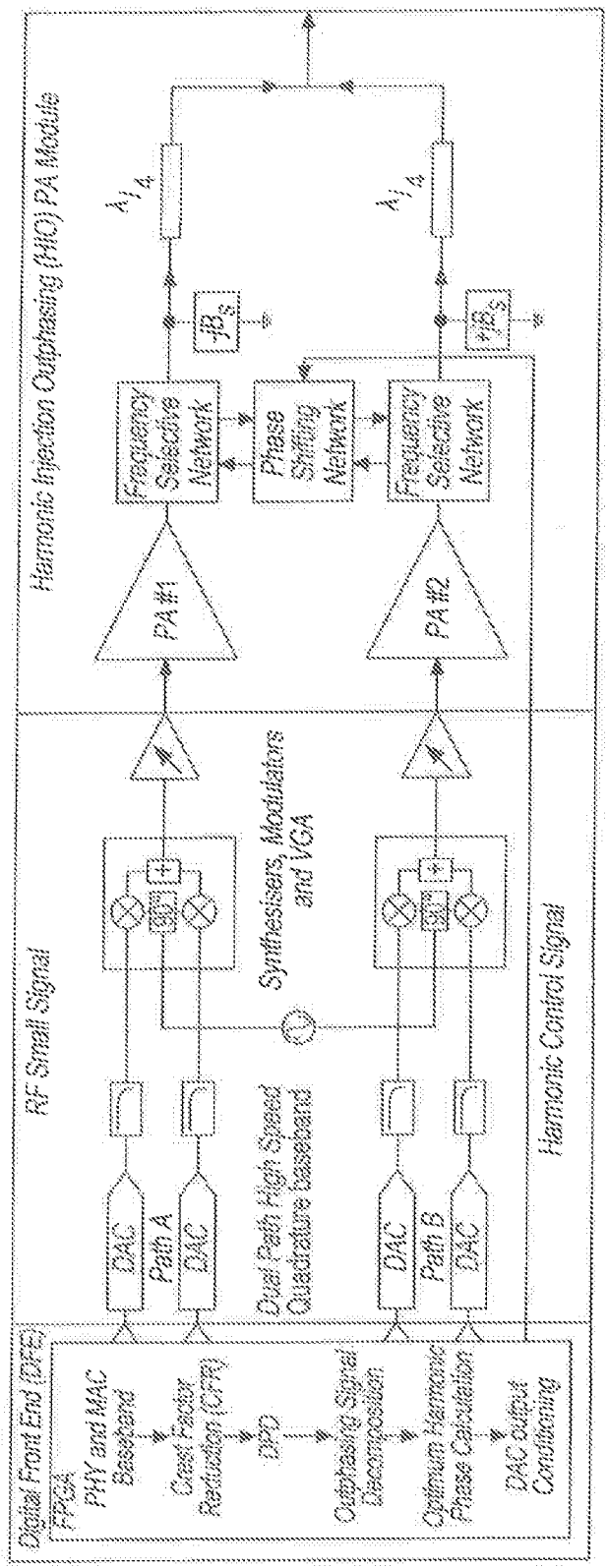
FIG. 21 shows a basic block diagram of an amplifier system architecture with a second harmonic injection outphasing PA system of an embodiment.

FIG. 21 shows a basic block diagram of an amplifier system architecture with a second harmonic injection outphasing PA system of an embodiment. The system comprises a digital front end, a RF small signal module and a harmonic injection amplifier module as described previously. In the digital front end filtering, interpolation and digital pre-distortion takes place. In addition to the components shows as part of the harmonic injection amplifier module an additional signal processing block is provided. This signal processing block consists of a function that decomposits the signal (using, for example, a CORDIC) and the algorithm for calculation of the optimum second harmonic impedance terminations described previously.

Another modification to a harmonic injection (HI) or harmonically optimised (HO) outphasing-based architecture is to implement the Signal Component Decomposition (SCD) in RF rather than digital. This avoids the requirements of using two separate IQ modulators and the DSP necessary for the component separator, representing both a cost and power saving.

The above discussion has focussed on optimising the efficiency of the amplifier system. The above described harmonics optimisation method, however, can alternatively be used to optimise or at least improve the linearity of the individual amplifiers and hence of the overall system. The harmonics needed for linearity improvement are different in amplitude and phase than those required for maximum efficiency. Depending on the application requirements, maximum efficiency, maximum linearity or a trade-off between the two can consequently be achieved by using the appropriate harmonics.

As previously mentioned in the case of the efficiency optimisation, the required harmonic signals/terminations can be determined either experimentally or analytically. The harmonics required to enhance amplifier linearity can be determined experimentally through simulations or load-pull measurements under multi-tone or other modulated signal excitation in the same manner as described above but relying on linearity metrics such as IMD3 or ACLR to determine the best harmonic termination over the outphasing trajectory. The same measurements can be performed by varying the amplitude and phase of the injected harmonics into the PA while it is driven with multi-tone or modulated signals.

Based on the results of these measurements, the injected signals—in the dynamic case—or the passive harmonic termination networks—for the static case—are designed to meet the application requirements in terms of linearity and/or efficiency. In other words, for the dynamic case the required phase and amplitude of the injected signals will be determined and used to drive the external harmonic injection network or the phase shifting network.

The above described harmonics optimisation method, however, can further alternatively be used to optimise or at least improve the efficiency and/or linearity of the dynamically adjustable systems discussed above with reference to FIGS. 8 to 12 over a wide frequency. As has been already discussed, the reactive load that is present due to the load-modulation effect is degrading the performance of the amplifiers. This is aggravated with increasing distance from the centre frequency of operation due to the frequency dependence response of all the components in the system (transistor parasitic, combiner, impedance transformation network etc.). This frequency dependence causes the load's reactance to change not only over the outphasing trajectory—as previously highlighted—but also over frequency i.e. the load reactance is not only a function of the output power back-off and outphasing trajectory, but also of the frequency of operation. This variable reactance further degrades the PA performance if is not appropriately compensated.

Through the use of the architecture of the embodiments, instead of minimising or cancelling out the reactance of the load—which is present in any case and cannot be completely eliminated—an appropriate harmonic signal is injected into the individual PA paths—in one of the discussed above with reference to FIGS. 8 to 12, compensating this variable reactance dynamically. In this way disadvantages with known ways of increasing the bandwidth of amplifiers, such as performance reduction or an increase in complexity, can be avoided. The magnitude and phase of the harmonic signals to be injected can be calculated either experimentally or analytically by using the impedance trajectories that correspond to the target frequency. Moving away from the centre frequency of operation, the load trajectories presented to the PA paths has the same general shape as is shown in FIGS. 15 and 16 but will be phase shifted, in other words rotated, affecting the reactances present over the trajectories. The new trajectories for a certain frequency can be determined through measurements, simulations or analytical calculations as they consist of passive networks well known in the area. Once these new trajectories are determined, the same methodology previously described can be followed to extract the optimal harmonic terminations.

Whilst certain embodiments have been described, these embodiments have been presented by way of example only, and are not intended to limit the scope of the inventions. Indeed, the novel devices, and methods described herein may be embodied in a variety of other forms; furthermore, various omissions, substitutions and changes in the form of the devices, methods and products described herein may be made without departing from the spirit of the inventions. The accompanying claims and their equivalents are intended to cover such forms or modifications as would fall within the scope and spirit of the inventions.

The invention claimed is:

1. An outphasing amplifier system with multiple amplification paths connected to a combiner for combination of signals amplified in the amplification paths, each amplification path comprising an amplifier, an impedance transformation network and a frequency selective network provided between the amplifier and the combiner,
   wherein the individual amplifiers operate in different operating modes and can interact through the combiner, causing an active load-pull effect; and
   wherein the frequency selective network is configured to:
      remove harmonic signal content generated by the amplifier from the signal provided to the combiner; and direct the harmonic signal content from downstream of the amplifier output to another amplification branch, via a phase shifting network in a manner that one or more of:
  reduces an overlap between the voltage and current waveforms within the amplifier connected to the frequency selective network during the active load pull operation;
  improves the linearity of one or more of the amplifiers; and
  improves the RF bandwidth of system.

2. An amplifier system as claimed in claim 1, wherein the frequency selective network is dynamically adjustable.

3. An amplifier system as claimed in claim 1, configured to disable one or more or all but one amplification path if the power of the input signal is below a predetermined threshold.

4. An amplifier system as claimed in claim 1, further configured to determine a power of an input signal and to disable the frequency selective network if the determined input power is below a predetermined threshold.

5. A system comprising an amplifier system as claimed in claim 1, wherein the system is a base station, a multi standard base station, a satellite, a node in a mobile area network and/or a node in a WLAN.

6. A system comprising an amplifier system as claimed in claim 5, wherein the system is a 802.11 ac WiFi, LTE, LTE-A and/or DVB-A system.

* * * * *